United States Patent [19]
Comerford

[11] Patent Number: 4,600,137
[45] Date of Patent: Jul. 15, 1986

[54] METHOD AND APPARATUS FOR MASS SOLDERING WITH SUBSEQUENT REFLOW SOLDERING

[75] Inventor: Matthias F. Comerford, Newton Highlands, Mass.

[73] Assignee: Hollis Automation, Inc., Nashua, N.H.

[21] Appl. No.: 703,735

[22] Filed: Feb. 21, 1985

[51] Int. Cl.[4] .............................................. B23K 31/02
[52] U.S. Cl. .................................. 228/102; 228/175; 228/180.1; 228/180.2; 228/187
[58] Field of Search ............... 228/240, 242, 175, 187, 228/180.1, 180.2, 102

[56] References Cited

U.S. PATENT DOCUMENTS

| | | |
|---|---|---|
| 3,500,536 | 3/1970 | Goldschmied . |
| 4,187,974 | 2/1980 | Mahajan . |
| 4,208,002 | 6/1980 | Comerford et al. . |
| 4,321,031 | 3/1982 | Woodgate .............................. 432/11 |
| 4,401,253 | 8/1983 | O'Rourke . |
| 4,402,448 | 9/1983 | O'Rourke ............................ 228/125 |
| 4,410,126 | 10/1983 | O'Rourke ......................... 228/180.1 |
| 4,446,358 | 5/1984 | Comerford et al. . |
| 4,451,000 | 5/1984 | Stephens . |
| 4,460,414 | 7/1984 | Hwang . |
| 4,465,219 | 8/1984 | Kondo .................................. 228/37 |
| 4,466,791 | 8/1984 | Jacobs et al. . |
| 4,515,304 | 5/1985 | Berger ................................ 228/187 |

OTHER PUBLICATIONS

IBM Technical Disclosure Bulletin, vol. 20, No. 7, Dec. 1977.

Primary Examiner—Nicholas P. Godici
Assistant Examiner—Samuel M. Heinrich
Attorney, Agent, or Firm—Hayes, Davis & Soloway

[57] ABSTRACT

An improved apparatus and method for mass soldering electrical and electronic components populating both the top and bottom surfaces of substrate circuit boards or the like in a single pass is described. The circuit boards pass through a mass soldering station first, and after a timed interval the circuit boards pass through a solder reflow station. The timed interval allows heat transfer through the circuit boards to reach its maximum.

14 Claims, 5 Drawing Figures

U.S. Patent   Jul. 15, 1986   Sheet 1 of 3   4,600,137
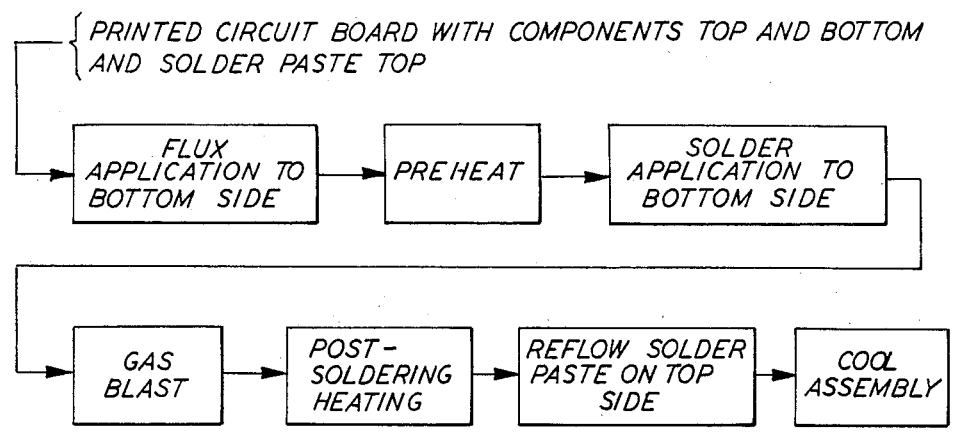
FIG. 1
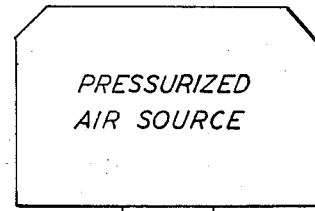
FIG. 4
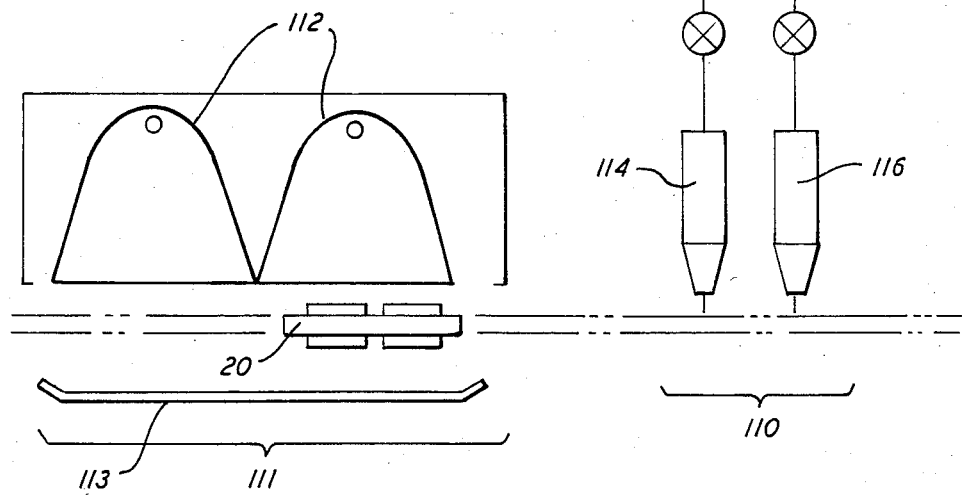

METHOD AND APPARATUS FOR MASS SOLDERING WITH SUBSEQUENT REFLOW SOLDERING

BACKGROUND OF THE INVENTON

This invention relates to systems for soldering electrical and electronic components onto substrate boards, and more particularly to an improved apparatus and method for mass soldering electrical and electronic components to the top and bottom surfaces of substrate circuit boards or the like in a single pass. The invention has particular application to soldering of surface mounted components such as chips or the like to both top and bottom surfaces of printed circuit boards and will be described in connection with such application. It will be understood, however, that the invention also may be used for soldering circuit boards having only conventional through-hole mounted components on the top surface alone, surface mounted components on the bottom surface alone or the combination of the two, and circuit boards having both conventional through-hole mounted components and surface mounted components on the top surface and surface mounted components on the bottom surface.

In response to recent demands for compact electronic appliances and instruments, there has been a tendency to use small, thin chip type electronic parts, i.e., surface mounted components and/or carriers therefor, for mounting on printed circuit boards in place of conventional, discrete type, leaded components. The advent of surface mounted component technology has afforded striking new levels of efficiency to the circuit board designer and, at the same time, has posed new challenges for the manufacturing engineer. Apart from the frequently noted advantages of component size and geometry, the circuit board designer has at his disposal the capability of populating both top and bottom surfaces of printed circuit boards with components.

Various techniques have been proposed by the art for mass soldering surface mounted components to a single sided circuit board. One technique involves fixturing the components to the bottom side surface of the board, e.g., using an epoxy adhesive or the like, and then engaging the bottom surface of the board and fixtured components with molten solder by passing the board bottom surface and fixtured components in contact with a body of molten solder as, for example, through the crest of a standing solder wave. Such a process is described in U.S. Pat. No. 4,465,219 to Kenshi Kondo.

It has also been proposed to solder surface mounted components to the top surface of a circuit board using a solder cream or paste, or a solder preform or the like. In such prior act technique, the surface mounted components are loaded in position on the top side surface of the board, together with suitable solder preforms or a solder cream or paste, and the circuit board and loaded components are heated to a temperature sufficient to reflow the solder. Heating to effect solder reflow can be accomplished by baking the circuit board and components in a radiant furnace or the like. Alternatively, the circuit board and components may be immersed in a vapor heated to a temperature above the melting point of the solder, in accordance with the so-called vapor phase soldering or condensation soldering process. Such a process is described in U.S. Pat. No. 3,866,307 and 4,321,031, which are given as exemplary. Radiant heating reflow soldering and vapor (condensation) soldering have achieved a certain degree of commercial acceptance although each technique has certain drawbacks. For one, the techniques are somewhat slow, and both techniques have a tendency to overheat components which could cause damage to heat sensitive components. Also radiant heating reflow soldering is susceptible to line-of-sight shadowing and thus may not be entirely satisfactory for high density applications. Furthermore, the fluid used to create the vapor for condensation soldering is quite expensive, and the thermal decomposition products of the fluid produced are dangerous to health.

While such prior art systems, in spite of the aforesaid and other disadvantages, are being used to solder surface mounted components to one surface of a circuit board, no system was heretofore available for mass soldering components populating both (opposed) surfaces of a printed circuit board in a single pass.

It is thus a primary object of the present invention to provide a mass soldering system, i.e., apparatus and process, which overcomes the aforesaid problems of the prior art.

Another object of the present invention is to provide an improved apparatus and process for mass soldering components to both (opposed) surfaces of a circuit board in a single pass.

Still other objects will appear obvious and in part will appear hereinafter.

The invention accordingly comprises the processes involving the several steps and relative order of one or more of such steps with respect to each other and the apparatus possessing the features, properties and relations of elements which are exemplified in the following detailed description and the scope of the application of which will be indicated in the claims.

In the following detailed description of the invention, the term "component" refers to so-called leadless components such as chip components as well as components having conventional metallic conductors or leads. The term "component lead" refers to that part of the metal conductor of an electrical or electronic component that is joined to the printed circuit board pattern, i.e. the component leads, terminals, lugs, pins, et cetera. The term "land" as used herein refers to that part of metallic pattern on the printed circuit board to which a component or component lead is joined by solder. the terms "top side surface" and "bottom side surface" as used herein with reference to the circuit board are meant simply to refer to the opposed broad surfaces of the circuit board; the terms "top" and "bottom" respectively denote spatial orientation of the circuit board only as it is being processed in the soldering apparatus in accordance with the present invention. The term "mass soldering" as used herein is intended to refer to any of the several soldering techniques known in the art in which (a) molten solder is applied to a circuit board from a body of molten solder, including by way of exanple, but not limitation: wave soldering, dip soldering, pot soldering, jet soldering, cascade soldering and drag soldering, or (b) a plurality of solder connections are made essentially simlutaneously by reflow of pre-applied solder preforms or solder cream or paste on a circuit board.

The present invention provides a novel system, i.e. method and apparatus, by which components populating both (opposed) surfaces of a printed circuit board may be mechanically and electrically joined to the printed circuit board by mass soldering in a single pass. More particularly, in accordance with the process aspect of the present invention, a circuit board containing components populating both top and bottom surfaces of the board is first subjected to a first mass soldering operation in which the bottom side surface of the board and components thereon are passed in contact with a body of molten solder as by passing through the crest of a standing solder wave. The first mass soldering operation also imparts substantial heat energy to the board which heat energy is conducted through to the top side surface of the board. Additional heat energy then is supplied to the top side surface of the board to reflow preapplied solder cream or paste or solder preforms on the board top side surface. The apparatus of the present invention comprises a fluxing station wherein flux may be applied to the bottom surface of the circuit board; a preheater station wherein the flux is activated and the board prepared for soldering; a first mass soldering station wherein the bottom side surface of the printed circuit board may be brought into contact with a pool of molten solder; and a second mass soldering station wherein preapplied solder cream or paste or solder preforms on the top side surface of the printed circuit board may be heated to reflow. In a preferred embodiment of the invention the first soldering station comprises a wave soldering assembly consisting of two wave-forming solder sumps including a first nozzle for forming a bidirectional wave and a second nozzle for forming a second substantially unidirectional wave, and the second mass soldering station comprises a convection heating assembly consisting of a pair of heated nozzles for directing heated fluid streams substantially vertically downwardly onto the top side surface of the board. In a particularly preferred embodiment of the invention the heated fluid comprises heated air. Completing the apparatus is means for transporting the circuit boards to be soldered in-line in timed sequence between the first mass soldering station and the second mass soldering (reflow) station.

For a fuller understanding of the object of the present invention, reference should be had to the following detailed description taken in connection with the accompanying drawings in which:

FIG. 1 is a flow diagram showing the various steps in the process of the present invention;

FIG. 4 is an enlarged diagrammatic view of a preferred form of the second mass soldering (reflow) station section of the apparatus in accordance with the present invention.

In several drawings like numerals refer to like parts.

Figure 2:
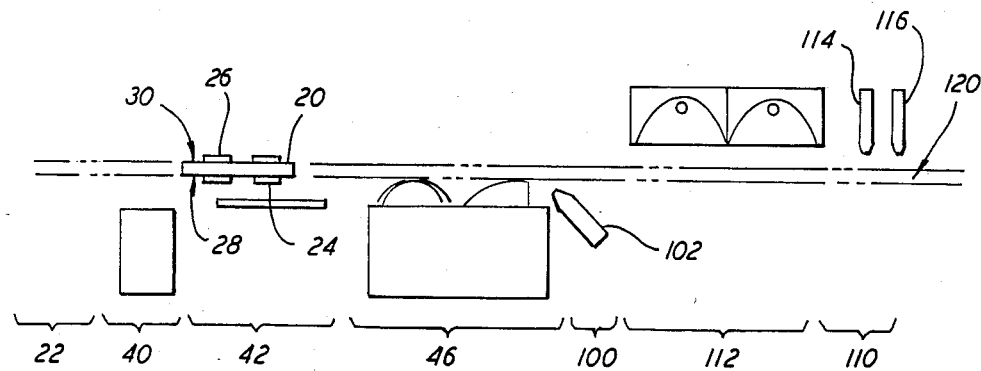
FIG. 2 is a side elevational view, diagrammatically illustrating a mass soldering system according to the present invention.

Referring to FIGS. 1 and 2, a printed circuit board 20 is loaded at an insertion station 22, with a plurality of electrical or electronic components 24, 26 at predetermined positions on the board. Board 20 comprises an insulated wiring board having one or more printed metallic conductors on the board bottom side surface 28 and one or more printed metallic conductors on the board top side surface 30. Components 24 are temporarily affixed in known manner in suitable locations on the board bottom side surface 28 by means of an adhesive such as heat resistant epoxy adhesive or the like. Similarly, surface mounted components or the like 26 are temporarily affixed to the board top side surface 30 by means of solder paste or the like applied to the component leads and circuit lands. If desired, components 26 also may be affixed to the circuit board by means of an epoxy adhesive or the like.

The next step involves treating the bottom side surface of the board with a so-called flux at a fluxing station 40. The flux may be any flux well known in the art, and may include, for example a water-white rosin, an activated rosin flux or a water soluble flux. The flux may be applied at fluxing station 40 by any manner well known in the art for example by spraying, foaming, brushing or from a flux wave.

The board is then passed from fluxing station 40 to a preheating station 42 where the board is preheated to mobilize the flux, and the bulk of the flux solvent is driven off to form an active flux layer on the board and component leads. Preheating station 42 may comprise radiant or convection heaters or a combination of radiant and convection heaters as are well known in the art.

Figure 3:
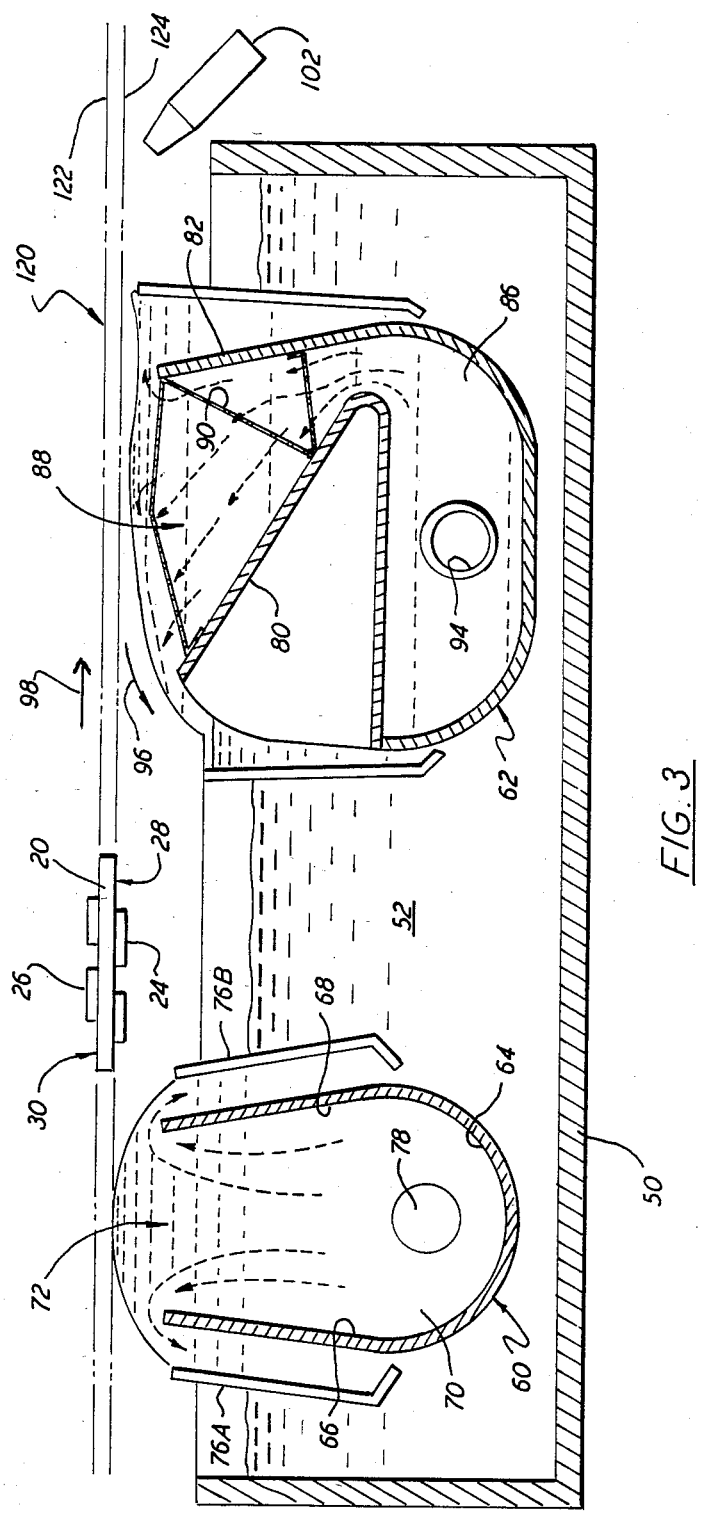
FIG. 3 is an enlarged diagrammatic view of a preferred form of the first mass soldering station section of the apparatus in accordance with present invention.

The fluxed preheated board is then passed to a first mass soldering station 46 which in a preferred embodiment of the invention comprises an integrated assembly of two wave soldering sumps and nozzles. Referring to FIGS. 2 and 3, mass soldering station 46 comprises a container of conventional design, indicated generally at 50 for holding a supply of molten solder 52. Conventional heating means (not shown) may be secured to the bottom and/or side walls of container 50 or immersed in the solder to heat and maintain the supply of solder 52 in molten condition.

First and second sump and nozzle assemblies indicated generally at 60 and 62, respectively, are disposed interiorly of container 50. First sump and nozzle assembly 60 typically comprises a bottom wall 64, a pair of inclined side walls 66, 68, and a pair of substantially vertically opposed ends walls only one of which 70 is shown. The upper ends of the end walls 70 and side walls 66 and 68 are spaced from one another to form a narrow elongated rectangular nozzle or slot 72 which extends above the molten solder level in container 50 a suitable distance, e.g. one inch above the molten solder level.

Preferably the sump also includes a pair of adjustable sluice plates 76A, B, spaced from the sump side walls 66 and 68 for controlling the solder overflow from the nozzle 60, e.g. in accordance with the teachings of U.S. Pat. No. 3,398,873 to Kenneth G. Boynton. A variable speed pump (not shown) communicating through an inlet orifice 78 in the lower end of sump and nozzle assembly 60 is provided for pumping solder in the sump where it rises and overflows the nozzle 72 as a narrow solder wave being a relatively large vertical component of momentum.

The second sump and nozzle assembly 62 comprises a sump and nozzle assembly made in accordance with the teachings of U.S. Pat. No. 4,208,002 to Matthias F. Comerford, et al. The second sump and nozzle assembly 62 thus comprises upwardly diagonally extending front wall 80 and a rear wall 82, and pair of vertically extending side walls 86 (only one of which is shown) connecting the front and rear walls to define a nozzle chamber of 88 in the form of an upwardly extending open-ended chamber of increasing plan area. A Z-shaped baffle screen 90 is positioned within the nozzle chamber 88 and distributes the molten solder pumped upwardly in the sump as a wide, smooth substantially unidirectional solder wave. A second variable speed pump (not shown) independently adjustable from the first variable speed pump, communicates through an intake orifice 94 located in the lower end of sump and nozzle assembly 62 for pumping molten solder into the sump where it then rises and overflows the nozzle 88 as a substantially unidirectional, standing soldering wave, whose flow direction (arrow 96) is counter to the direction of the board and conveyor travel as indicated by arrow 98. Preferably, sump and nozzle assembly 62 is arranged for oil intermix operation in accordance with the teachings of U.S. Pat. No. 3,058,441 to Walker et al.

Immediately following the first mass soldering station 46 is an excess solder removal station 100 which is optional but preferred. Excess solder removal station 100 follows first mass soldering station 42 immediately in-line and is designed to remove and/or relocate solder on the board underside and any interconnections, component leads and/or component bodies carried thereon before the solder solidifies as shorts, icicles and/or bridges, i.e., in accordance with the teachings of U.S. Pat. No. 4,410,126 to Harold T. O'Rourke. Solder removal station 100 comprises one or more heated fluid jets, fluid knives, slots, nozzles or the like indicated generally at 102 from which a heated fluid stream, preferably hot air, is directed onto the underside of the board. Inert gas may be used as the fluid, but preferably the fluid comprises heated air. The hot air blast also shapes the fillets of surface mounted coponents, and it relocates the molten solder on the board so as to assure good solder coverage over the entire board including recesses between adjacent chip components. Solder removal station 100 also permits the use of a horizontal conveyor which has certain advantages as will be described hereinafter. Hot air knife 102 should be oriented so as to direct the hot air blast in a direction opposite to the direction of board travel. Generally, nozzle 102 is disposed at an angle of between about 30° and about 80° from the horizontal, and preferably is at an angle of between about 58° and about 65° from the horizontal. The exact angle may be varied depending on the angle of travel path of the board. In the case of a substantially horizontal conveyor, nozzle 102 preferably is at an angle of about 60° from the horizontal.

The air should be preheated to a temperature at least equal to the liquids temperature of the solder, and preferably will be at a temperature of about 90° and 200° C. (measured from the outlet of nozzle 102) higher than the liquidus temperature of the solder. For 63/37 solder alloy, the air should be heated to a temperature of about 395° C. (measured at the outlet of nozzle 102).

As taught in U.S. Pat. No. 4,410,126 to Harold T. O'Rourke, the fluid (hot air) stream impinging on the still molten solder contained on the underside of the circuit board, the interconnections and component leads and/or component bodies should have sufficient velocity to relocate excess solder on and/or blast excess solder from the underside of the board, inter-connections, leads and bodies so as to minimize the possibility of icicling or short formation opon solidification, but should not be so great as to disturb adequately wetted solder connections. Generally, in the case of air heated to a temperature of about 395° C., the air should have a fluid velocity (measured at the outlet of nozzle 102) of between about one and about two m/sec. The appropriate temperature/pressure parameters may be determined empirically. If desired a minor amount, e.g. up to about 20% by weight of liquid droplets, e.g. soldering oil and/or liquid flux also may be included in the fluid stream as by aspirating the liquid into the fluid stream as taught in O'Rourke U.S. Pat. No. 4,410,126.

As will be appreciated, passing the circuit board 20 and components through the dual soldering waves and over the optional heated air knife imparts substantial heat energy into the bottom side surface of circuit board. However, inasmuch as circuit boards per se are not good thermal conductors, the heat energy imparted to the board bottom side surface only slowly rises through the board to the top side surface. It has been observed that in the case of a two sided circuit board formed of phenolic and having a board thickness of about 62 mil, there is a 15 to 20 second time lag between emergence of the board from the second solder wave and maximization of temperature on the board top side surface. Moreover, the temperature ultimately reached by the board top side surface from heat inputted from the solder waves and the optional heated air knife is not sufficient by itself to produce fusing of the solder cream or paste and/or preforms on the board top side surface. The present invention makes maximum use of the heat inputed from the wave soldering operation, and adds sufficient additional heat to raise the temperature of the top side surface of the board sufficiently high to reflow the solder cream or paste and/or preforms on the board top side surface. This can be accomplished at a top side solder reflow station 110 as will be described in detail hereinafter.

As noted supra, there is a time lag between emergence of the board from the second solder wave and maximization of temperature on the board top side surface. In order to minimize heat energy loss from the circuit board during this time lag, a post soldering holding station 111 preferably is located between mass wave soldering station 46 and reflow station 110. Post soldering holding station 111 preferably includes one or more heat reflectors 113 located under the travel path of the boards, and one or more heaters 112 located over the travel path of the boards. While post soldering heaters 112 may add some heat to the circuit boards being processed, the primary function of the post soldering heaters 112 is to maintain the temperature environment of the board as the heat from the bottom side surface of the board rises through the board to the top side surface. The post soldering heaters may comprise radiant or convection heaters or convection heaters or a combination of radiant and convection heaters as are well known in the art. Preferably, post soldering heaters 112 comprise one or a plurality of parabolic infrared heaters mounted over the top side surface of the board.

Figure 5:
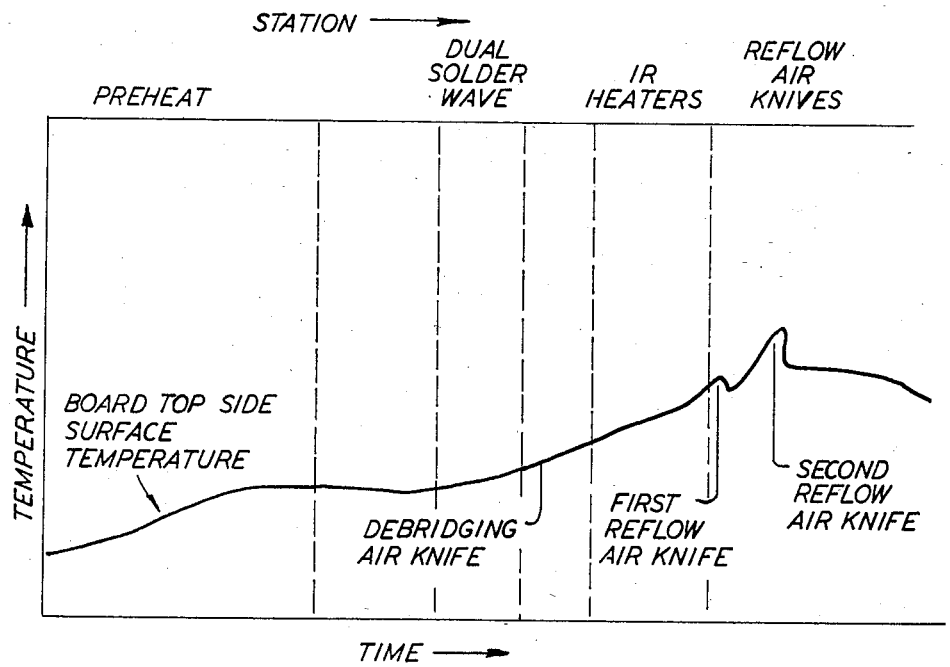
FIG. 5 is a graph illustrating measurements representing time/temperature profiles of the top side surface of circuit boards being processed in accordance with the teachings of the present invention.

Following immediately post soldering heaters 112 in-line is reflow station 110. Reflow station 110 may comprise a radiant furnace, but preferably comprises one or more heated knives, fluid jets, slots, nozzles or the like indicated at 114 and 116, from which a low pressure heated fluid stream is directed to the top side surface of the board. Fluid knives 114 and 116 are similar in construction to fluid nozzle 102 and are arranged to impinge a stream of heated fluid, preferably heated air, onto the top side surface of the board. A single air knife can be used under certain circumstances; however, it has been found that the temperature spike achieved through the use of a single air knife typically does not raise the top side surface temperature of the board sufficiently high to effect reflow. On the other hand, it has been found that the combination of two closely spaced hot air knives, e.g. 4.5 inches apart directly over the circuit board, e.g. within about ⅛-¼ inches above the circuit board, unexpectedly spike the top side surface of the board to a temperature sufficiently high to effect reflow. This is shown in FIG. 5, which illustrates time/temperature profiles of the top side surface of a circuit board processed in accordance with the present invention.

Air knives 114 and 116 should be adapted to preheat the air to a temperature of in the range of 350°-425° C. so as to provide the desired temperature spike. Unlike the debridging nozzle 102 provided adjacent the wave soldering station 46 of the apparatus, the air velocity through nozzles 114 and 116 should be adjusted to be quite low and typically may be 1/10th to 1/15th of the velocity of the air emerging from nozzle 102. Air flow rate, air temperature, pressure and the time elapsed between circuit board emerging from the wave soldering station and beginning of contact by the heated air stream on the board top side surface may vary widely depending on board thickness, ambient temperature, melting point of the solder preforms or solder cream or paste, specific heat of gas or air, heat transfer co-efficient of gas to the board, board size and shape, component density, amount of solder preforms or solder cream or paste deposited, conveyor speed and distance between the soldering station 62 and reflow station 110. As noted supra, it has been determined empirically that a 15 to 20 second lag exists between emergence of the circuit board from the solder wave to maximization of temperature on the top side surface of the printed circuit board. Thus, the conveyor speed and distance between solder wave station 62 and reflow station 110 should be selected as to take advantage of the maximumizaton of top side temperature.

The solder cream or paste may comprise any commercially available solder cream or paste. Preferably the solder cream or paste comprises solder powder on the order of 350 mesh suspended in a fluxing material and vehicle. Preferably but not necessarily the solder cream or paste will be of the same chemical composition as the solder utilized in the wave soldering station so that constitutents of the solder on both top and bottom surfaces of the solder board will be identical. Various solder creams and pastes are available commercially and may be utilized in accordance with the present invention.

Completing the apparatus is a conveyor system 120. The latter is of conventional construction and typically comprises a pair of spaced conveyor rails 122 and 124 and suitable drive means (not shown). Preferably conveyor system 110 operates substantially in the horizontal plane so that the boards being processed are carried by conveyor 120 along a substantially horizontal travel path. The provision of the air knife 102 immediately following the second solder sump and nozzle 62 assures bridge-free soldering even in the horizontal mode. Operating in the horizontal mode minimizes possible problems of component shifting on the board top side surface. Employing a horizontal transport system also simplifies loading and unloading transitions.

A particular feature and advantage of the present invention is the ability to mass solder both sides of a circuit board in a single pass through the soldering system. This results in substantial manufacturing economies, and in addition limits temperature cycling of the circuit board assembly to a single cycle.

Various changes may be made in the foregoing invention without departing from the inventive features described herein. For example, three or more heated air knives may be employed in the reflow (fusing) station 110 if additional thermal "kick" is required, e.g. as in the case of particularly high density boards. Also, reflow (fusing) station 110 may comprise radiant heaters or a combination of radiant and convection heaters. Also, if desired, a final cooling nozzle (not shown) may be provided following reflow station 110.

Still other changes may be made in accordance with the present invention without departing from the spirit and scope thereof. Accordingly, it is intended that all matter contained in the above description or shown in the accompanying drawings shall be interpreted in an illustrating and not in a limiting sense.

I claim:

1. Apparatus for mass joining with solder electrical and electronic components affixed on a circuit board and populating both the top side surface of the board and the bottom side surface of the board, and comprising in combination:

a mass soldering station adapted a deposit a quantity of molten solder onto the bottom side surface of said board and any components affixed thereto whereby to electrically and mechanically join said components to the bottom side of said board;

a solder reflow station adapted to heat the top side surface of said board sufficient to reflow solder preforms and/or solder paste or cream thereon whereby to electrically and mechanically join any components thereon to the top side surface of said board; and means for transporting said circuit board in line between said mass soldering station and said solder reflow station in timed sequence, said timed sequence being adjusted to bring said board into said reflow station at or near the time at which heat transfer through said board has reached its maximum amount.

2. Apparatus according to claim 1, and further including heating means located between said mass soldering station and said solder reflow station for maintaining the temperature of the board as it is transported between said soldering stations.

3. Apparatus according to claim 1, and further including an excess solder removal station adjacent said mass soldering station and following immediately thereafter, said excess solder removal station comprising at least one gas jet disposed below the travel path of said board and adapted to direct a fluid stream onto the freshly deposited solder on said bottom side surface of said board and components thereon before said solder fully solidifies thereon, a source of pressurized fluid, and means connecting said source and said at least one jet; said excess solder removal station being adapted to relocate or remove a portion of said molten solder deposited on said bottom side surface of said board and said components before said molten solder solidifies thereon as icicles and/or bridges.

4. Apparatus according to claim 3, wherein said source comprises pressurized air.

5. Apparatus according to claim 2, wherein said post soldering heating station comprises at least one radiant heater disposed along the travel path of said board.

6. Apparatus according to claim 1, wherein said reflow station comprises at least one gas jet disposed above the travel path of said board and adapted to direct a fluid gas stream onto said board top said surface; a source of pressurized fluid and means connecting said source and said at least one fluid jet; and means for heating said fluid to a temperature sufficient to raise the temperature of said board top side surface to reflow any solder preforms, solder cream or solder paste thereon.

7. Apparatus according to claim 6 and including at least two gas jets substantially vertically downwardly directed, in line along said travel path.

8. Apparatus according to claim 7 wherein said source comprises a source of pressurized air.

9. Apparatus according to claim 8 and including means for heating said air to a temperature in the range of 350° to 425° C.

10. Apparatus according to claim 1, wherein said mass soldering station comprises an integrated assembly consisting of first and second wave forming solder sumps.

11. Apparatus according to claim 10, wherein said first solder sump comprises a sump and nozzle capable of producing a narrow wave having a relatively large vertical component of momentum, and said second solder sump comprises a sump and nozzle capable of creating a substantially unidirectional solder wave whose flow is in a direction opposite to the direction of transport of said circuit board.

12. A method for mass joining with solder electrical and electronic components populating both sides of the circuit board, said method comprising the steps of:
depositing a quantity of molten solder onto the bottom side surface of said board and components thereon and permitting the solder to solidify thereon;
holding said board whereby to permit the heat energy on the bottom side surface of said board to rise through to the top side surface of said board and reach substantially maximum temperature due to heat transfer through said board; and
immediately thereafter heating the board top side surface to a temperature sufficient to reflow any solder preforms, solder creams or paste thereon.

13. A method according to claim 12, wherein said heating to reflow follows within about 15 to 20 seconds following application of said molden solder onto the bottom side surface of said board.

14. A method according to claim 12, and including the step of maintaining said circuit board in a heated or insulated environment during said holding in order to minimize loss of heat energy from said board.

* * * * *

UNITED STATES PATENT AND TRADEMARK OFFICE
CERTIFICATE OF CORRECTION

PATENT NO. : 4,600,137

DATED : July 15, 1986

INVENTOR(S) : Matthias COMERFORD

It is certified that error appears in the above—identified patent and that said Letters Patent is hereby corrected as shown below:

Claim 1, line 26, after the word "adapted" delete "a" and insert the word --to--.

Signed and Sealed this

Thirtieth Day of September 1986

[SEAL]

Attest:

DONALD J. QUIGG

Attesting Officer

Commissioner of Patents and Trademarks